United States Patent
Chang et al.

(10) Patent No.: US 7,673,375 B2
(45) Date of Patent: Mar. 9, 2010

(54) METHOD OF FABRICATING A POLYMER-BASED CAPACITIVE ULTRASONIC TRANSDUCER

(75) Inventors: Ming-Wei Chang, Taipeing (TW); Da-Chen Pang, Kaohsiung (TW); Chao-Sheng Tseng, Chiayi County (TW)

(73) Assignee: Industrial Technology Research Institute, Hsinchu (TW)

( * ) Notice: Subject to any disclaimer, the term of this patent is extended or adjusted under 35 U.S.C. 154(b) by 1191 days.

(21) Appl. No.: 11/212,611

(22) Filed: Aug. 29, 2005

(65) Prior Publication Data
US 2007/0013266 A1 Jan. 18, 2007

(30) Foreign Application Priority Data
Jun. 17, 2005 (TW) .............................. 94120108 A

(51) Int. Cl.
*H01G 7/00* (2006.01)
(52) U.S. Cl. .................. 29/25.42; 29/594; 29/609.1; 29/856; 29/868; 310/333; 310/337; 310/357; 310/367; 347/54; 347/68; 347/69; 347/70; 347/72
(58) Field of Classification Search ............... 29/25.35, 29/592.1, 594, 602.1, 609.1, 856, 868; 347/54, 347/68–72; 310/333–337, 357, 367
See application file for complete search history.

(56) References Cited

U.S. PATENT DOCUMENTS

| | | | | |
|---|---|---|---|---|
| 5,619,476 | A | 4/1997 | Haller et al. ................. | 367/181 |
| 5,834,880 | A * | 11/1998 | Venkataramani et al. .... | 310/334 |
| 6,249,075 | B1 | 6/2001 | Bishop et al. ................ | 310/338 |
| 6,295,247 | B1 | 9/2001 | Khuri-Yakub et al. ........ | 367/140 |
| 6,328,696 | B1 | 12/2001 | Fraser ......................... | 600/459 |
| 6,430,109 | B1 | 8/2002 | Khuri-Yakub et al. ........ | 367/181 |

FOREIGN PATENT DOCUMENTS

| | | |
|---|---|---|
| DE | 69313583 T | 4/1998 |
| DE | 69618952 T | 11/2002 |
| JP | 2003500955 | 1/2003 |
| JP | 2003500955 T | 1/2003 |
| JP | 2003503923 T | 1/2003 |

* cited by examiner

Primary Examiner—Paul D Kim
(74) Attorney, Agent, or Firm—WPAT., P.C.; Justin King

(57) ABSTRACT

A method of fabricating a polymer-based capacitive ultrasonic transducer, which comprises the steps of: (a) providing a substrate; (b) forming a first conductor on the substrate; (c) coating a sacrificial layer on the substrate while covering the first conductor by the same; (d) etching the sacrificial layer for forming an island while maintaining the island to contact with the first conductor; (e) coating a first polymer-based material on the substrate while covering the island by the same; (f) forming a second conductor on the first polymer-based material; (g) forming a via hole on the first polymer-based material while enabling the via hole to be channeled to the island; and (h) utilizing the via hole to etch and remove the island for forming a cavity.

14 Claims, 7 Drawing Sheets

METHOD OF FABRICATING A POLYMER-BASED CAPACITIVE ULTRASONIC TRANSDUCER

FIELD OF THE INVENTION

The present invention relates to a method of fabricating a polymer-based capacitive ultrasonic transducer, and more particularly, to a method capable of fabricating a polymer-based capacitive ultrasonic transducer with reduced cost.

BACKGROUND OF THE INVENTION

Ultrasonic imaging has found widespread use in industrial and medical applications. Flaw detection, thickness measurement, and diagnostic imaging are just a few of the tools utilizing this technology. All information acquired by the ultrasound system passes through the transducer before being processed and presented to the operator. Therefore, the performance characteristics of the transducer can significantly influence system performance, especially when the miniaturization of ultrasonic transducer is the trend of future development. It possesses several advantages over other techniques, like x-rays or magnetic resonance imaging (MRI), including being noninvasive, relatively inexpensive, portable, and capable of producing a tomographical image—an image of a two-dimensional slice of the body. Another very important advantage is that ultrasound produces images fast enough to monitor the motion of structures within the body, such as a fetus or a beating heart. Close attention should be paid to the design and fabrication of a proper transducer for the application, taking into consideration the performance of the imaging system as a whole.

Currently, the most commonly seen ultrasonic transducers are piezoelectric ultrasonic transducers, which require ceramic manufacturing processes and have acoustic impedance similar to a solid mass that it is not suitable for operating in a gaseous or liquid ambient. Therefore, capacitive micromachined ultrasonic transducers (CMUTs) have been considered an attractive alternative to conventional piezoelectric transducers in many areas of application, since the acoustic impedance match of a CMUT to air/liquid is closer than that of piezoelectric ultrasonic transducers, due to the small mechanical impedance of the thin transducer membrane. Please refer to FIG. 29, which is a cross-sectional view of a conventional piezoelectric ultrasonic transducer. An ultrasonic transducer of FIG. 29 comprises: an layer of active element 32, which is piezo or ferroelectric material; a backing layer 30; and a wear plate 36, for protecting the transducer from the testing environment; wherein a matching layer 34 is sandwiched between the layer of active element 32 and the ware plate 36 for enhancing wave-emission efficacy.

In addition to lager operating range, better sensitivity, preferred resolution, the CMUTs also provide the following advantages over piezoelectric transducers; CMUTs can be batch produced with a standard IC process to right parameter specifications, which is difficult with lead zirconium titanate (PZT) transducers. This means that near-electronics can be integrated with the transducer. It is easier to make transducer arrays from CMUTs than from PZTs. Moreover, a CMUT can operate in a wider temperature range than a PZT device. Furthermore, the acoustic impedance match of a CMUT to air is closer than that of PZT transducers, due to the small mechanical impedance of the thin transducer membrane. That is, when both is operating in air, the operating frequency of a CMUT is in the range of 200 KHz and 5 MHZ while that of a PZT transducer is only in the range of 50 KHz and 200 KHz that the different between the operation band of the two transducers has caused troubles and restrictions in the application point of view.

A capacitive micromachined ultrasonic transducer is a device where two plate-like electrodes are biased after which an ac signal is applied on top of the dc bias to harmonically move one of the plates. The main parts of a CMUT are the cavity, the membrane and the electrode.

In 1998, a surface micromachining technique is disclosed by Jin, et al., which is adapted for fabricating a capacitive ultrasonic transducer capable of operating in air and immersed in water. The surface micromachining technique comprises the steps of: providing a high doped silicon wafer with preferred conductivity as the substrate of the transducer; depositing a first layer of nitride by low pressure chemical vapor deposition (LPCVC) at 800° C. for protecting a button electrode; depositing a layer of amorphous-silicon (a-Si) as a sacrificial layer; dry-etching the sacrificial layer to form a plurality of hexagon island; depositing a second layer of nitride to form a membrane and hexagon frames supporting the membrane; dry-etching the second layer of nitride to form via holes; removing the a-Si by feeding in KOH through the via holes at 75° C. so as to form a cavity; depositing a layer of silicon oxide to seal the via holes; plating a layer of aluminum; and patterning the layer of aluminum by wet-etching so as to form a top electrode.

In 2002, in order to deal with the membrane stress adversely affecting the performance of a capacitive transducer, a low-temperature manufacturing technique with a annealing process is developed and disclosed by Cianci, et al. for manufacturing a capacitive ultrasonic transducer, the technique comprises the steps of: provide a polymide as a sacrificial layer; etching the polymide to form a plurality of hexagon islands by means of reactive ion etch (RIE); vapor-depositing a silicon oxide to form hexagon frames, each having a height the same as that of the sacrificial layer for supporting a membrane; depositing a layer of silicon nitride to form the membrane at 380° C. by plasma enhanced chemical vapor deposition (PECVD); and annealing at 510° C. for 10 hours for eliminating the compressive stress of the membrane while conserving only a slight tensile stress thereof. Moreover, the top electrode of the transducer is formed by lithographic patterning while the button electrode is being plated at the back of the silicon wafer.

However, the two aforesaid manufacturing techniques all have problems of high processing temperature, high residue stress, uncontrollable features of manufacturing, and high cost, and thus a certain corresponding procedures should be adopted in the manufacturing processes for resolving the foregoing problems, such as adopting an annealing procedure to reduce the residue stress so as to prevent the membrane to be damaged by deformation. In addition, most prior-art transducers have their cavity of excitation formed by etching a silicon-based material, such that an obvious Lamb Wave effect can occur, and furthermore, the ultrasonic transducer can be in an unstable state since the cavity and the membrane thereof are made of different materials which have different thermal expansion coefficient.

Therefore, it is in great demand to have a polymer-based capacitive ultrasonic transducer capable of overcoming the shortcomings of any prior-art transducers.

SUMMARY OF THE INVENTION

In view of the disadvantages of prior art, the primary object of the present invention is to provide a method of fabricating a polymer-based capacitive ultrasonic transducer, which employs the benefits of a polymer material such as cheap, easy to process and being capable of being made in large size so as to reduce the manufacturing cost while enable an uncomplicated manufacturing process.

To achieve the above object, the present invention provides a method of fabricating a polymer-based capacitive ultrasonic transducer, comprising the steps of:
(a) providing a substrate;
(b) forming a first conductor on the substrate;
(c) coating a sacrificial layer on the substrate while covering the first conductor by the same;
(d) etching the sacrificial layer for forming an island while maintaining the island to contact with the first conductor;
(e) coating a first polymer-based material on the substrate while covering the island by the same;
(f) forming a second conductor on the first polymer-based material;
(g) forming a via hole on the first polymer-based material while enabling the via hole to be channeled to the island; and
(h) utilizing the via hole to etch and remove the island for forming a cavity.

In a preferred aspect, the step (b) of the fabricating method of the invention further comprises a step of: (b1) coating the first conductor on the substrate while enabling the substrate to be covered completely by the first conductor.

In a preferred aspect, the step (b) of the fabricating method of the invention further comprises a step of: (b2) etching the first conductor while patterning the same, the step (b1) being performed after the step (b1).

In a preferred embodiment of the invention, the method of fabricating a polymer-based capacitive ultrasonic transducer further comprises a step of: (i) covering the second conductor completely by a second polymer-based material.

In another preferred embodiment of the invention, the method of fabricating a polymer-based capacitive ultrasonic transducer further comprises a step of: (i') covering the second conductor completely by a second polymer-based material wile sealing the via hole.

Preferably, the substrate is made of silicon.
Preferably, the first conductor is made of a metal.
Preferably, the first conductor of step (b) is formed on the substrate by means of sputtering.
Preferably, the second conductor is made of a metal.
Preferably, the second conductor of step (f) is formed on the first polymer-based material by means of sputtering.
Preferably, the sacrificial layer is made of a metal, which can be copper.
Preferably, the etching performed in the step (h) is wet etching.
Preferably, the first polymer-based material is the SU-8 photo-resist produced by International Business Machines Corp (IBM).

Other aspects and advantages of the present invention will become apparent from the following detailed description, taken in conjunction with the accompanying drawings, illustrating by way of example the principles of the present invention.

DESCRIPTION OF THE PREFERRED EMBODIMENT

For your esteemed members of reviewing committee to further understand and recognize the fulfilled functions and structural characteristics of the invention, several preferable embodiments cooperating with detailed description are presented as the follows.

Figure 1:
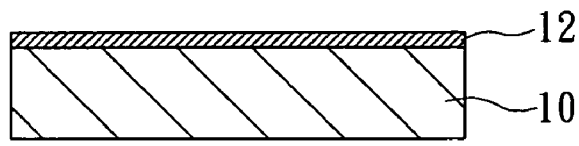
FIG. 1 to FIG. 9 are schematic diagrams sequentially arranged for illustrating steps of a method of fabricating a polymer-based capacitive ultrasonic transducer according to a first embodiment of the invention.
Figure 2:
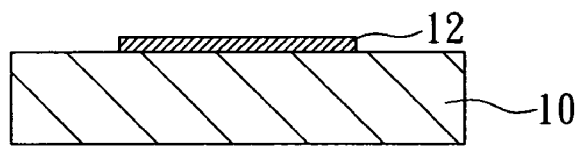
Figure 3:
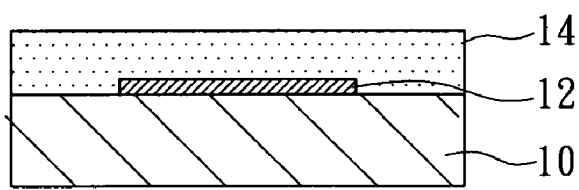
Figure 4:
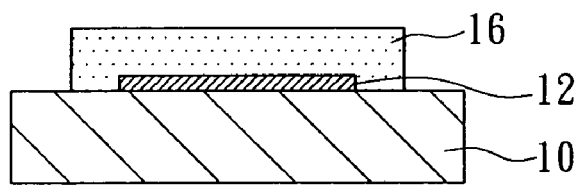
Figure 5:
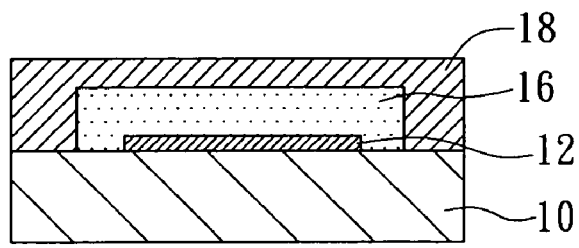
Figure 6:
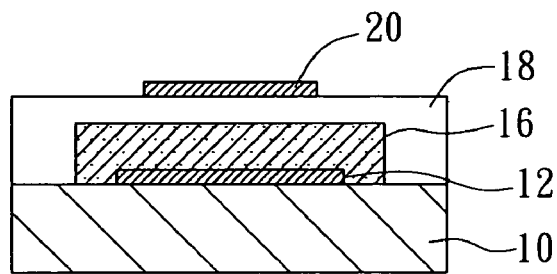
Figure 7:
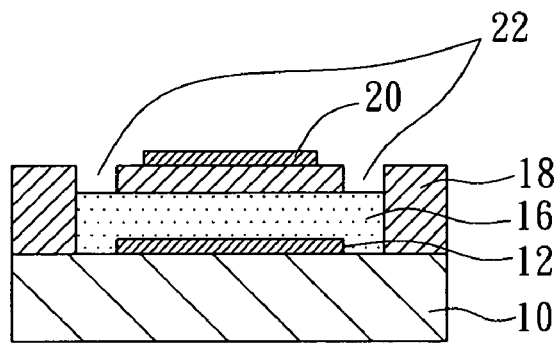
Figure 8:
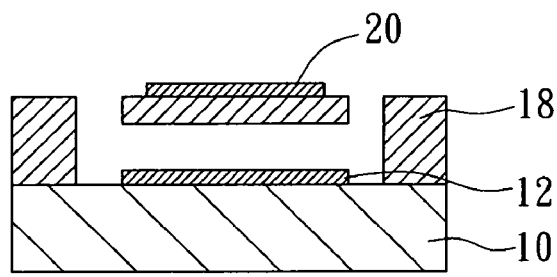
Figure 9:
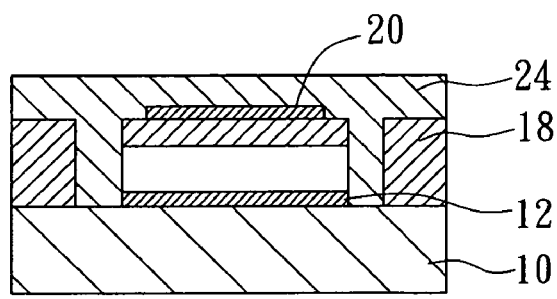
Figure 10:
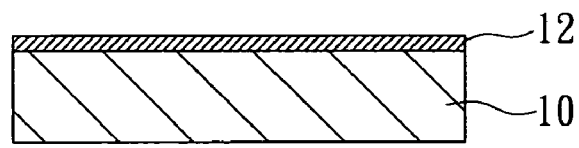
FIG. 10 to FIG. 16 are schematic diagrams sequentially arranged for illustrating steps of a method of fabricating a polymer-based capacitive ultrasonic transducer according to a second embodiment of the invention.

Please refer to FIG. 1 to FIG. 9, which are schematic diagrams sequentially arranged for illustrating a flowchart of a method of fabricating a polymer-based capacitive ultrasonic transducer according to a first embodiment of the invention. The process starts from a step shown in FIG. 1, where a substrate 10 having a layer of conductor 12 deposited thereon is provided, and then the process proceeds to the step shown in FIG. 2. In FIG. 2, the layer of conductor 12 is being etched to form a specific pattern and then the process proceeds to the step shown in FIG. 3. In FIG. 3, a sacrificial layer 14 is being coated on the substrate 10 while enabling the patterned conductor 12 to be covered by the same, and then the process proceeds to the step shown in FIG. 4. In FIG. 4, the sacrificial layer 14 is being etched to form an island 16 contacting the patterned conductor 12, and then the process proceeds to the step shown in FIG. 5. In FIG. 5, a layer of a polymer-based material 18 is formed on the substrate 10 while enabling the island 16 to be covered completely by the same, and then the process proceeds to the step shown in FIG. 6. In FIG. 6, another layer of conductor 20 is being formed on the layer of polymer-based material 18, and then the process proceeds to the step shown in FIG. 7. In FIG. 7, two via holes 22 is being formed on the layer of polymer-based material 18 while enabling the via holes 22 to be channeled to the island 16, moreover, the number of via hole is not limited by 2, i.e. there can be any numbers of via holes formed on the layer of polymer-based material 18, and then the process proceeds to the step shown in FIG. 8. In FIG. 8, the island 16 is being wet-etched and removed utilizing the via holes 22 so as to form a cavity, and then the process proceeds to the step shown in FIG. 9. In FIG. 9, a layer of another polymer-based material 24 is formed on the conductor 20 while sealing the via holes 22 by the same so that the conductors 12, 20 can be protected from the damage of dust and moisture, and the process is complete.

Figure 11:
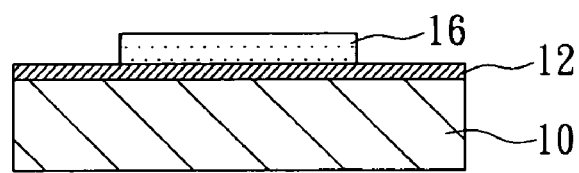
Figure 12:
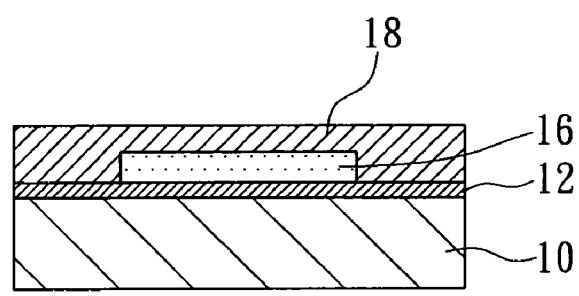
Figure 13:
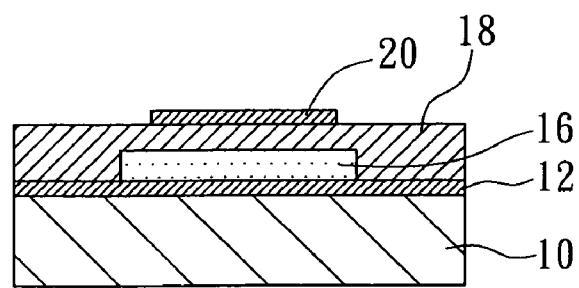
Figure 14:
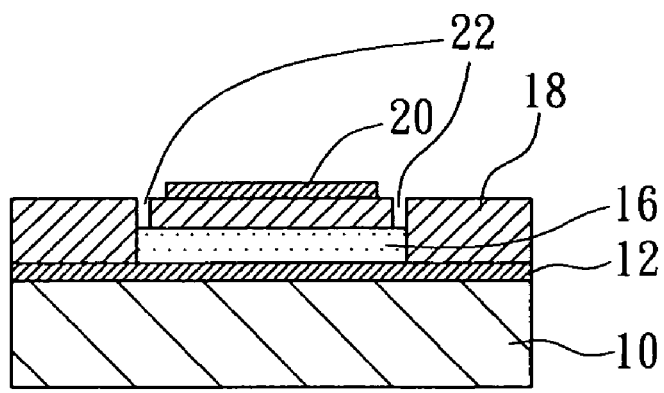
Figure 15:
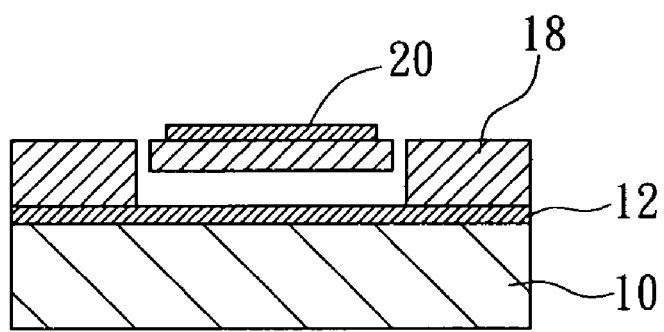
Figure 16:
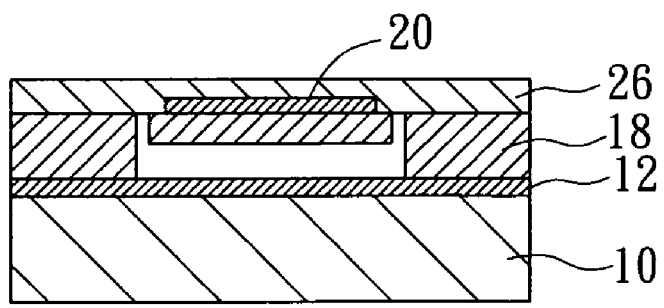
Figure 17:
FIG. 17 to FIG. 28 are schematic diagrams sequentially arranged for illustrating steps of a method of fabricating a polymer-based capacitive ultrasonic transducer according to a third embodiment of the invention.

Please refer to FIG. 10 to FIG. 16, which are schematic diagrams sequentially arranged for illustrating a flowchart of a method of fabricating a polymer-based capacitive ultrasonic transducer according to a second embodiment of the invention. The process starts from a step shown in FIG. 10, where a substrate 10 having a layer of conductor 12 deposited thereon is provided, and then the process proceeds to the step shown in FIG. 11. In FIG. 11, an island 16 is formed on the conductor 12, and then the process proceeds to the step shown in FIG. 12. In FIG. 12, a layer of polymer-based material 18 is formed on the layer of conductor 12 while enabling the island 16 to be covered by the same, and then the process proceeds to the step shown in FIG. 13. In FIG. 13, another conductor 20 is formed on the layer of polymer-based material 18, and then the process proceeds to the step shown in FIG. 14. In FIG. 14, two via holes 22 is being formed on the layer of polymer-based material 18 while enabling the via holes 22 to be channeled to the island 16, moreover, the number of via hole is not limited by 2, i.e. there can be any numbers of via holes formed on the layer of polymer-based material 18, and then the process proceeds to the step shown in FIG. 15. In FIG. 15, the island 16 is being wet-etched and removed utilizing the via holes 22 so as to form a cavity, and then the process proceeds to the step shown in FIG. 16. In FIG. 16, a layer of another polymer-based material 24 is formed on the conductor 20 while sealing the via holes 22 by the same so that the conductors 12, 20 can be protected from the damage of dust and moisture, and the process is complete. Furthermore, while forming the layer of polymer-based material 24 as seen in FIG. 16, by selecting a proper polymer-based material and performing the forming of the layer of polymer-based material 24 by means of spin coating, the cohesion between molecules of the polymer-based material 24 is larger than the gravity exerting thereon so that the polymer-based material 24 will not drip and flow in the via holes 22, that is, the via holes 22 will not be filled by the polymer-based material 24.

Figure 18:
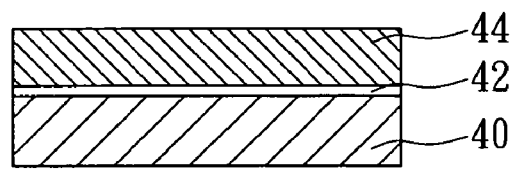
Figure 19:
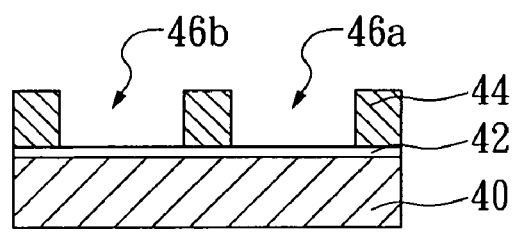
Figure 20:
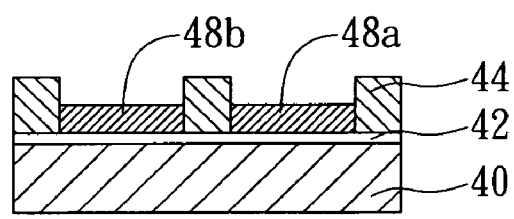
Figure 21:
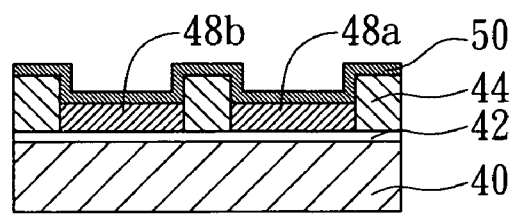
Figure 22:
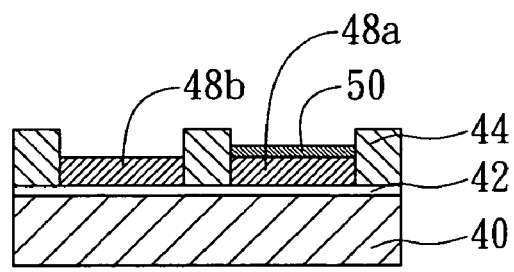
Figure 23:
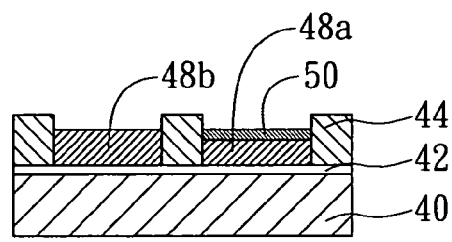
Figure 24:
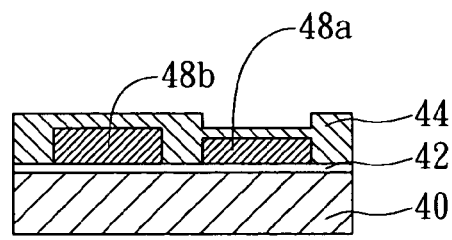
Figure 25:
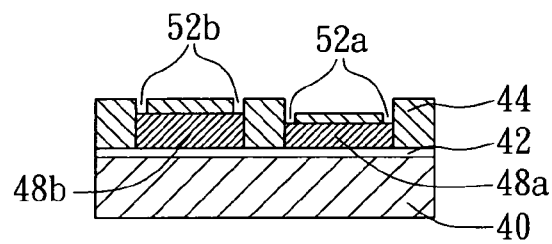
Figure 26:
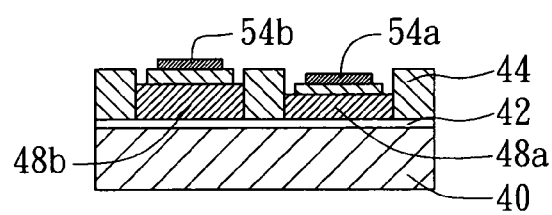
Figure 27:
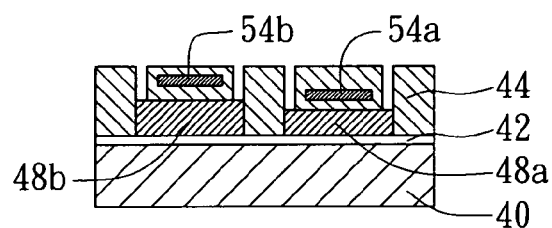
Figure 28:
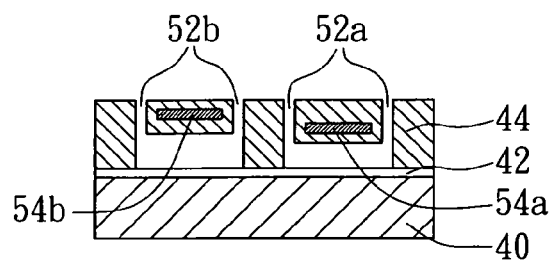
Figure 29:
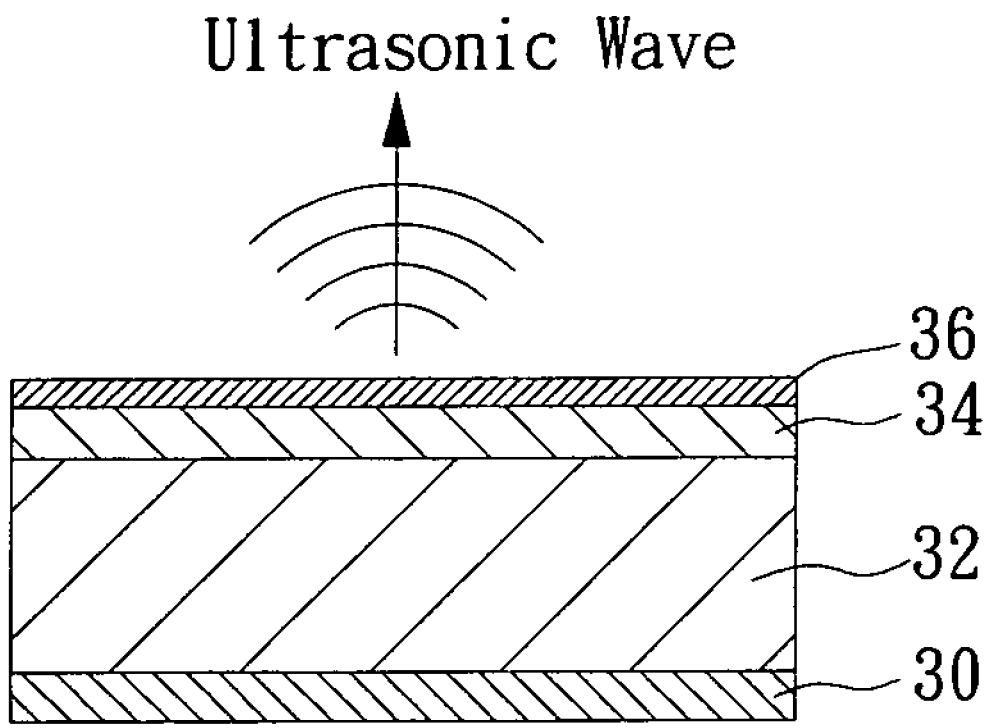
FIG. 29 is a cross-sectional view of a conventional piezoelectric ultrasonic transducer.

Please refer to FIG. 17 to FIG. 28, which are schematic diagrams sequentially arranged for illustrating a flowchart of a method of fabricating a polymer-based capacitive ultrasonic transducer according to a third embodiment of the invention. The process starts from a step shown in FIG. 17, where a substrate 40 having a layer of conductor 42 deposited thereon is provided, and then the process proceeds to the step shown in FIG. 18. In FIG. 18, spin coating a polymer-based material 44 on the conductor 42 while enabling the conductor 42 to be covered by the same, and then the process proceeds to the step shown in FIG. 19. In FIG. 19, the polymer-based material 44 are etched so as to form two exposure areas 46a, 46b, and then the process proceeds to the step shown in FIG. 20. In FIG. 20, two sacrificial layers 48a, 48b are formed respectively in the two exposure areas 46a, 46b, and then the process proceeds to the step shown in FIG. 21. In FIG. 21, a photo-resist 50 is spin coated on the polymer-based material 44 and the two sacrificial layers 48a, 48b, and then the process proceeds to the step shown in FIG. 22. In FIG. 22, a portion of the photo-resist 50 is being removed while enabling another portion of the photo-resist 50 superimposing the sacrificial layer 48a to remain, and then the process proceeds to the step shown in FIG. 23. In FIG. 23, the sacrificial layers 48b is being thickened, and then the process proceeds to the step shown in FIG. 24. In FIG. 24, all the remaining photo-resist 50 is being removed and then a layer of the polymer-based material 44 is being spin coated on the two sacrificial layers 48a, 48b while enabling the two sacrificial layers 48a, 48b to covered completely by the same, and then the process proceeds to the step shown in FIG. 25. In FIG. 25, two via holes 52a, 52b is being formed respectively on the layer of polymer-based material 44 while enabling the via holes 52a, 52b to be channeled respectively to the two sacrificial layers 48a, 48b, and then the process proceeds to the step shown in FIG. 26. In FIG. 26, two conductors 54a, 54b are formed respectively on the two sacrificial layers 48a, 48b accordingly, and then the process proceeds to the step shown in FIG. 27. In FIG. 27, the two conductors 54a, 54b are being covered by a layer of polymer-based material 44, and then the process proceeds to the step shown in FIG. 28. In FIG. 28, the two sacrificial layers 48a, 48b are being etched and removed respectively by utilizing the via holes 52a, 52b so as to form a cavity. By virtue of this, a polymer-based capacitive ultrasonic transducer with two cavities of different air gaps can be obtained as seen in FIG. 28.

In a preferred embodiment of the invention, the substrate can be a silicon wafer; the plural conductors can be formed by sputtering metal on the substrate or the layer of polymer-based material; the sacrificial layer can be made of a metal, which can be copper, etc.; and the polymer-based material can be the SU-8 photo-resist produced by International Business Machines Corp (IBM).

From the above description, it is noted that, by using a polymer-base material of cheap, ease-to-process, capable of being made in large size, an d capable of being processed in low temperature, the complicated process and high temperature procedure of prior-art manufacturing process can be avoided while reducing the processes needed for making the matching layer, the capacitive ultrasonic transducer of the invention can be a highly competitive product with high performance, high orientation capability, enhanced sensitivity and larger dynamic inspection range that can be applied in medical imaging, non-destructive inspecting, and displacement, flow rate and level inspecting, and so on.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A method of fabricating a polymer-based capacitive ultrasonic transducer, comprising steps of:
    (a). providing a substrate;
    (b). forming a first conductor on the substrate;
    (c). coating a first polymer-based material on the first conductor while covering the first conductor by the first polymer-based material;
    (d). etching the first polymer-based material for forming an exposure area;
    (e). forming a sacrificial layer in the exposure area;
    (f). coating a second polymer-based material on the sacrificial layer while covering the sacrificial layer completely by the second polymer-based material;
    (g). forming a via hole on the second polymer-based material while enabling the via hole to be channeled to the sacrificial layer;
    (h). forming a second conductor on the second polymer-based material;
    (i). covering the second polymer-based material by a third polymer-based material; and
    (j). utilizing the via hole to etch and remove the sacrificial layer for forming a cavity.

2. The method of claim 1, wherein the first conductor is made of platinum.

3. The method of claim 1, wherein the sacrificial layer is made of a metal.

4. The method of claim 3, wherein the metal is copper.

5. The method of claim 1, wherein at least one material selected from the group consisting of the first polymer-based material, the second polymer-based material and the third polymer-based material is the SU-8 photo-resist produced by International Business Machines Corp (IBM).

6. The method of claim 1, wherein the second conductor is made of a metal.

7. The method of claim 1, wherein the etching performed in the step (j) is wet etching.

8. A method of fabricating a polymer-based capacitive ultrasonic transducer, comprising steps of:
- (a). providing a substrate;
- (b). forming a first conductor on the substrate;
- (c). coating a first polymer-based material on the first conductor while covering the first conductor by the first polymer-based material;
- (d). etching the first polymer-based material for forming two exposure areas;
- (e). forming two sacrificial layers in the two exposure areas respectively;
- (f). forming a photo-resist on the two sacrificial layers;
- (g). removing a portion of the photo-resist with respect to one of the sacrificial layers;
- (h). thickening the sacrificial layer without the photo-resist on the top;
- (i). removing the photo-resist;
- (j). coating a second polymer-based material on the two sacrificial layers while covering the two sacrificial layers completely by the second polymer-based material;
- (k). forming two via holes respectively on the layer of polymer-based material while enabling the via holes to be channeled respectively to the two sacrificial layers;
- (l). forming a second conductor on the second polymer-based material;
- (m). covering the second polymer-based material by a third polymer-based material; and
- (n). utilizing the via holes to etch and remove the two sacrificial layers for forming two cavities having different air gaps.

9. The method of claim 8, wherein the first conductor is made of platinum.

10. The method of claim 8, wherein the sacrificial layer is made of a metal.

11. The method of claim 10, wherein the metal is copper.

12. The method of claim 8, wherein at least one material selected from the group consisting of the first polymer-based material, the second polymer-based material and the third polymer-based material is the SU-8 photo-resist produced by International Business Machines Corp (IBM).

13. The method of claim 8, wherein the second conductor is made of a metal.

14. The method of claim 8, wherein the etching performed in the step (n) is wet etching.

* * * * *